US006992688B2

(12) United States Patent
Shimazu et al.

(10) Patent No.: US 6,992,688 B2

(45) Date of Patent: Jan. 31, 2006

(54) METHOD FOR DEVELOPING MULTILAYER IMAGEABLE ELEMENTS

(75) Inventors: Ken-Ichi Shimazu, Briarcliff Manor, NY (US); Kevin B. Ray, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 147 days.

(21) Appl. No.: 10/766,345

(22) Filed: Jan. 28, 2004

(65) Prior Publication Data

US 2005/0162505 A1 Jul. 28, 2005

(51) Int. Cl.

*B41J 2/315* (2006.01)
*B41J 2/435* (2006.01)
*G03F 7/26* (2006.01)
*G03F 7/30* (2006.01)

(52) U.S. Cl. .................. 347/171; 347/224; 101/463.1; 101/465; 101/466; 430/300; 430/302

(58) Field of Classification Search ................ 347/171, 347/224; 101/463.1, 465, 466; 430/300, 430/302

See application file for complete search history.

(56) References Cited

U.S. PATENT DOCUMENTS

| | | | | |
|---|---|---|---|---|
| 5,217,848 | A | 6/1993 | Uehara et al. | |
| 5,398,092 | A | 3/1995 | Tanno et al. | |
| 5,839,011 | A | 11/1998 | Urasaki et al. | |
| 5,858,589 | A | 1/1999 | Govaert et al. | |
| 5,887,214 | A | 3/1999 | Kuriu et al. | |
| 6,280,899 | B1 | 8/2001 | Parsons et al. | |
| 6,294,311 | B1 | 9/2001 | Shimazu et al. | |
| 6,352,811 | B1 | 3/2002 | Patel et al. | |
| 6,352,812 | B1 | 3/2002 | Shimazu et al. | |
| 6,358,669 | B1 | 3/2002 | Savariar-Hauck et al. | |
| 6,478,483 | B2 | 11/2002 | Maruyama et al. | |
| 6,528,228 | B2 | 3/2003 | Hauck et al. | |
| 6,555,291 | B1 | 4/2003 | Hauck | |
| 6,562,555 | B2 * | 5/2003 | Fiebag et al. | 430/399 |
| 6,593,055 | B2 | 7/2003 | Shimazu et al. | |
| 6,759,185 | B2 * | 7/2004 | Fiebag et al. | 430/399 |
| 6,844,141 | B1 * | 1/2005 | Patel et al. | 430/303 |
| 6,855,487 | B2 * | 2/2005 | Fiebag et al. | 430/399 |

FOREIGN PATENT DOCUMENTS

| | | |
|---|---|---|
| EP | 0908307 | 4/1999 |
| EP | 0908784 | 4/1999 |
| EP | 1023994 | 8/2000 |
| EP | 0864420 | 5/2001 |
| EP | 0908305 | 11/2001 |
| EP | 0950518 | 1/2002 |

(Continued)

OTHER PUBLICATIONS

Kodak Polychrome Graphics Mercury Processor Range, Kodak Polychrome Graphics Company Ltd., 1999.

Kodak Aqua-Image Negative Plate Processor, Eastman Kodak Company, 1991.

*Primary Examiner*—Huan Tran

(74) *Attorney, Agent, or Firm*—Ratner Prestia

(57) ABSTRACT

A method for forming an image by imaging and developing a multi-layer imageable element, in which the developer is fresh developer and the developer is not reused, is disclosed. Much smaller variation in dot percentage is obtained when each imaged imageable element is developed in fresh developer than when the developer is reused to develop additional imaged imageable elements. The method is especially suited to the formation of images using stochastic screening. Either a solvent based developer or a high pH developer may be used.

14 Claims, 1 Drawing Sheet

FOREIGN PATENT DOCUMENTS

| | | |
|---|---|---|
| EP | 0940266 | 6/2002 |
| EP | 0960728 | 5/2003 |
| JP | 2001-042509 | 2/2001 |
| JP | 2001-042510 | 2/2001 |

* cited by examiner

METHOD FOR DEVELOPING MULTILAYER IMAGEABLE ELEMENTS

FIELD OF THE INVENTION

The invention relates to lithographic printing. In particular, this invention relates to a method for forming an image using multi-layer, positive-working, thermally imageable elements that are useful as lithographic printing plate precursors.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive-working. Conversely, if the unimaged regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

To form the desired image, the original image is converted to a geometric distribution of dots, known as a halftone image. The eye does not see the individual halftone dots, but only sees the corresponding "spatially integrated" density value.

Two types of halftone screening are used in lithographic printing. In conventional halftone screening, sometimes called Amplitude Modulation (AM) screening, the halftone dots that together simulate the original image are arranged on a fixed geometric grid. By varying the size of the halftone dots the image can be simulated. In stochastic screening, sometimes called Frequency Modulated (FM) screening, the dots are the same size but the number of dots and their location is varied to simulate the original image. The concept of stochastic screening is that halftone dots placed randomly, instead of in a fixed pattern, will not cause moiré patterns.

Imaging of the imageable element with ultraviolet and/or visible radiation has typically been carried out through a mask, which has clear and opaque regions. However, direct digital imaging, which obviates the need for imaging through a mask, is becoming increasingly important in the printing industry. Imageable elements for the preparation of lithographic printing plates have been developed for use with infrared lasers. Thermally imageable, multi-layer elements are disclosed, for example, in Shimazu, U.S. Pat. No. 6,294,311, U.S. Pat. No. 6,352,812, and U.S. Pat. No. 6,593,055; Patel, U.S. Pat. No. 6,352,811; Savariar-Hauck, U.S. Pat. No. 6,358,669, and U.S. Pat. No. 6,528,228; and U.S. patent application Ser. No. 10/264,814; the disclosures of which are all incorporated herein by reference.

Although conventional developers and methods of processing work well with imaged thermally imageable multilayer elements that have been imaged using conventional halftone screening, unacceptable variations in dot percentages are observed throughout the developer loading cycle when the imageable elements have been imaged using stochastic screening. The resultant tone images are inconsistent and the halftone dots are liable to fatten with plates processed later in the developer loading cycle. Thus, a need exists for a method for processing imageable elements that have been imaged using stochastic screening that does not produce unacceptable variations in dot percentages throughout the developer loading cycle.

SUMMARY OF THE INVENTION

It has been discovered that, when thermally imageable, multi-layer imageable elements are developed, a much smaller variation in dot percentage is obtained when each imaged imageable element is developed in fresh developer than when the developer is reused to develop additional imaged imageable elements. Thus, the invention is a method for forming an image comprising the steps of:

a) thermally imaging a multi-layer imageable element and forming an imaged imageable element comprising imaged and complementary unimaged regions;

in which:

the imageable element comprises a substrate, an underlayer over the substrate, and a top layer over the underlayer;

the element comprises a photothermal conversion material;

the top layer is substantially free of the photothermal conversion material;

the top layer is ink receptive;

before thermal imaging, the top layer is not removable by an alkaline developer;

after thermal imaging, the imaged regions are removable by the developer; and the underlayer is removable by the developer; and b) developing the imaged imageable element with the developer and removing the imaged regions without substantially affecting the unimaged regions;

in which:

the developer is fresh developer; and the developer is not reused.

The method is especially suited for imaging and developing imageable elements using stochastic screening. Either solvent based or high pH developers may be used.

DETAILED DESCRIPTION OF THE INVENTION

Figure 1:
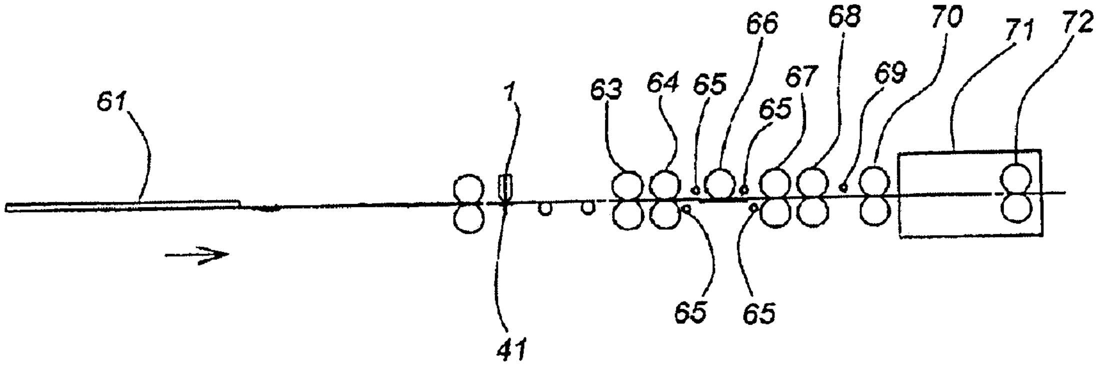
FIG. 1 shows development of an imaged imageable element using a processor.

Unless the context indicates otherwise, in the specification and claims, the terms binder, dissolution inhibitor, novolac resin, photothermal conversion material, organic solvent, and similar terms also include mixtures of such materials. Unless otherwise specified, all percentages are percentages by weight. Thermal imaging refers to imaging with a hot body, such as a thermal head, or with infrared radiation.

Processing

Thermally imageable, multi-layer imageable elements may be prepared and imaged as described below. Imaging produces an imaged imageable element, which comprises a latent image of imaged regions and complementary unimaged regions. Development, also referred to as processing, of the imaged element to form a printing plate converts the latent image to an image by removing the imaged regions, revealing the hydrophilic surface of the underlying substrate.

A much smaller variation in dot percentage is obtained when each imaged imageable element is developed in fresh developer than when the developer is reused to develop additional imaged imageable elements. "Fresh developer" is developer that has not been previously used to develop imaged imageable elements.

Although the manner of application of the developer to the imaged imageable elements is not important as long as fresh developer is used, for reasons of economy, the developer is preferably applied in such a way that the minimum amount of developer required for development is used. The developer may be applied, for example, from a spray bar, from a slot dye, or by reverse roll coating, such as is shown in Kurui, U.S. Pat. No. 5,887,214, the disclosure of which is incorporated herein by reference.

One way of applying the developer is, for example, by using the apparatus depicted in FIG. 1. Referring to FIG. 1, imaged imageable element 61 is conveyed in the direction of the arrow and processed with a predetermined amount of developer. Developer is spread on the surface of the imaged imageable element via slot die 1, while imaged imageable element 61 is supported by support 41, which may be for example, a platform. The development time can be controlled by the distance from slot die 1 to pair of squeeze rollers 63 and the transport rate. Typical development times are about 10 sec to about 30 sec. Excess and used developer exits the processor through a drain in the processor tank floor (not shown) and is disposed of. The developer is not reused, that is, the developer is not reused in the process to develop additional imaged imageable elements.

The minimum amount of developer required for development may vary with the composition of the developer, the composition of the layers of the imageable element, the method of application of the developer, and the development conditions, such as the time and temperature used for development. For example, less developer is typically used when the developer is applied with a slot coater/slot die than when it is applied with a spray bar. However, typically about 0.5 L to 4.0 L of developer is used per $m^2$ of imaged imageable element.

The developer penetrates and removes the imaged regions of the top layer and the underlying layer or layers without substantially affecting the complimentary unimaged regions. While not being bound by any theory or explanation, it is believed that image discrimination is based on a kinetic effect. The imaged regions of the top layer are removed more rapidly in the developer than the unimaged regions. Development is carried out for a long enough time to remove the imaged regions of the top layer and the underlying regions of the other layer or layers of the element, but not long enough to remove the unimaged regions of the top layer. Hence, the top layer is described as being "not removable" by, or "insoluble" in, the developer prior to imaging, and the imaged regions are described as being "soluble" in, or "removable" by, the developer because they are removed, i.e. dissolved and/or dispersed, more rapidly in the developer than the unimaged regions. Typically, the underlayer is dissolved in the developer and the top layer is dissolved and/or dispersed in the developer.

Next the imaged imageable element is washed with water through pair of guide rollers 64. In this step, any remaining coating debris is removed by scrubbing roller 66, while feeding water in a shower state from blast pipe 65. Scrubbing roller 66 may be, for example, a brush roller or a plush roller. The rinse solution on the surface of the element is removed with pair of squeeze rollers 67.

The element is transferred to the finishing treatment step, via pair of guide rollers 68. In the finishing treatment step, water or a finishing solution is fed to the surface of the element in a shower state from blast pipe 69. The finishing or gumming solution comprises one or more water-soluble polymers, for example polyvinyl alcohol, polymethacrylic acid, polymethacrylamide, polyhydroxyethylmethacrylate, polyvinylmethylether, gelatin, and polysaccharide such as dextrine, pullulan, cellulose, gum arabic, and alginic acid. A preferred material is gum arabic.

After water is squeezed from the element surface by pair of squeeze rollers 70, the resulting printing plate is dried in a drying area 71 and carried out by guide rollers 72. Drying may be conveniently carried out by infrared radiators or with hot air.

The developed and gummed plate can be baked to increase the press runlength of the plate. Baking can be carried out, for example, at about 220° C. to about 260° C. for about 5 minutes to about 15 minutes, or at a temperature of about 110° C. to about 130° C. for about 25 to about 35 min.

Developers

High pH developers have been used for multi-layer positive-working imageable elements. However, the imaged multi-layer positive working imageable elements can be developed in a solvent based developer. Solvent based developers, also known as negative developers, have been used to develop negative-working, rather than positive-working, imageable elements.

A high pH developer typically has a pH of at least about 11, more typically at least about 12, preferably from about 12 to about 14. High pH developers comprise at least one alkali metal silicate, such as lithium silicate, sodium silicate, and/or potassium silicate. Sodium silicate and potassium silicate are preferred, and potassium silicate is most preferred. A mixture of alkali metal silicates may be used if desired. Especially preferred high pH developers comprise an alkali metal silicate having a $SiO_2$ to $M_2O$ weight ratio of at least of at least about 0.3, in which M is the alkali metal. Preferably, the ratio is from about 0.3 to about 1.2. More preferably, it is from about 0.6 to about 1.1, and most preferably, it is from about 0.7 to about 1.0.

The amount of alkali metal silicate in the high pH developer is typically at least 20 g of $SiO_2$ per 1000 g of developer (that is, at least about 2 wt %) and preferably about 20 g to 80 g of $SiO_2$ per 1000 g of developer (that is, about 2 wt % to about 8 wt %). More preferably, it is about 40 g to 65 g of $SiO_2$ per 1000 g of developer (that is, about 4 wt % to about 6.5 wt %).

In addition to the alkali metal silicate, alkalinity can be provided by a suitable concentration of any suitable base, such as, for example, ammonium hydroxide, sodium hydroxide, lithium hydroxide, and/or potassium hydroxide. A preferred base is potassium hydroxide. Optional components of high pH developers are anionic, nonionic and amphoteric surfactants (up to 3% on the total composition weight), biocides (antimicrobial and/or antifungal agents), antifoaming agents or chelating agents (such as alkali gluconates), and thickening agents (water soluble or water dispersible polyhydroxy compounds such as glycerin or polyethylene glycol). However, these developers typically do not contain organic solvents. Typical commercially available high pH developers include: Goldstar™ Developer, 4030 Developer, PD-1 Developer, and MX 1813 Developer, all available from Kodak Polychrome Graphics, Norwalk, Conn.

Solvent based alkaline developers typically have a pH below about 10.5, especially below 10.2 (measured at 25° C.). Solvent-based developers comprise water and an organic solvent or a mixture of organic solvents. They are typically free of silicates, alkali metal hydroxides, and mixtures of silicates and alkali metal hydroxides. The developer is a single phase. Consequently, the organic solvent or mixture of organic solvents must be either miscible with water or sufficiently soluble in the developer that phase separation does not occur. Optional components include anionic, nonionic and amphoteric surfactants (up to 3% on the total composition weight), and biocides (antimicrobial and/or antifungal agents).

The following solvents and mixtures thereof are suitable for use in solvent-based developers: the reaction products of phenol with ethylene oxide (phenol ethoxylates) and with propylene oxide (phenol propoxylates), such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and propylene glycol with alkyl groups having six or fewer carbon atoms, such as 2-ethoxyethanol, 2-(2-ethoxy)ethoxyethanol, and 2-butoxyethanol. A developer that comprises phenoxyethanol is preferred. The developer typically comprises about 0.5 wt % to about 15 wt %, preferably about 3 wt % to about 5 wt %, of the organic solvent or solvents, based on the weight of the developer. Typical commercially available solvent based developers include: AQUA-IMAGE® Developer, PRONEG® D501 Developer, MX 1725 Developer, MX 1587 Developer, 956 Developer, 955 Developer, and SP200, all available from Kodak Polychrome Graphics, Norwalk, Conn., USA.

Thermally Imageable, Multi-layer Imageable Elements

Thermally imageable, multi-layer imageable elements comprise a substrate, an underlayer, and a top layer. Others layers may be present. The elements also comprise a photothermal conversion material. They are disclosed, for example, in Shimazu, U.S. Pat. No. 6,294,311, U.S. Pat. No. 6,352,812, and U.S. Pat. No. 6,593,055; Patel, U.S. Pat. No. 6,352,811; and Savariar-Hauck, U.S. Pat. No. 6,358,669, and U.S. Pat. No. 6,528,228; as well as U.S. patent application Ser. No. 09/638,556, filed Aug. 14, 2000, the disclosures of which are all incorporated herein by reference. Commercially available thermally imageable, multi-layer imageable elements include the SWORD® Excel and SWORD® Ultra (both from Kodak Polychrome Graphics, Norwalk, Conn., USA).

Substrate

The substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a cylinder in a printing press, typically about 100 $\mu$m to about 600 $\mu$m. Typically, the substrate comprises an interlayer between the aluminum support and the underlayer. The interlayer may be formed by treatment of the aluminum support with, for example, silicate, dextrine, hexafluorosilicic acid, phosphate/fluoride, polyvinyl phosphonic acid (PVPA) or vinyl phosphonic acid copolymers.

The back side of the support (i.e., the side opposite the underlayer and top layer) may be coated with an antistatic agent and/or a slipping layer or matte layer to improve handling and "feel" of the imageable element.

Underlayer

The underlayer comprises a polymeric material that is removable by the developer, and preferably soluble in the developer. In addition, the polymeric material is preferably insoluble in the solvent used to coat the top layer so that the top layer can be coated over the underlayer without dissolving the underlayer. Other ingredients, such as resole resins, added copolymers, photothermal conversion materials, and surfactants, may also be present in the underlayer. Useful polymeric materials include carboxy functional acrylics, vinyl acetate/crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, incorporated herein by reference.

Particularly useful polymeric materials are polyvinylacetals and copolymers that comprise N-substituted maleimides, especially N-phenylmaleimide; methacrylamides, especially methacrylamide; and acrylic and/or methacrylic acid, especially methacrylic acid. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. These polymeric materials are soluble in a methyl lactate/methanol/dioxolane (15:42.5:42.5 wt %) mixture, which can be used as the coating solvent for the underlayer. However, they are poorly soluble in solvents such as acetone and toluene, which can be used as solvents to coat the top layer over the underlayer without dissolving the underlayer.

These polymeric materials can be prepared by methods, such as free radical polymerization, well known to those skilled in the art. One or more other polymeric materials may also be present in the combination. Preferred other polymeric materials, when present, are novolac resins.

Top Layer

The top layer is over the underlayer. The top layer becomes soluble or dispersible in the developer following thermal exposure. It typically comprises an ink-receptive polymeric material, known as the binder, and a dissolution inhibitor. Alternatively, or additionally, the polymeric material comprises polar groups and acts as both the binder and dissolution inhibitor.

Any top layer used in multi-layer thermally imageable elements may be used in the imageable elements of the invention. Top layers are described for example in Savariar-Hauck, U.S. Pat. Nos. 6,3358,669, and 6,555,291, the disclosures of which are incorporated herein by reference.

Preferably, the binder in the top layer is a light-stable, water-insoluble, developer-soluble, film-forming phenolic resin. Phenolic resins have a multiplicity of phenolic hydroxyl groups, either on the polymer backbone or on pendent groups. Novolac resins, resol resins, acrylic resins that contain pendent phenol groups, and polyvinyl phenol resins are preferred phenolic resins. Novolac resins are more preferred. Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-resol, mixtures of m-cresol and p-cresol, or phenol with formaldehyde using conventional conditions.

A solvent soluble novolac resin is one that is sufficiently soluble in a coating solvent to produce a coating solution that can be coated to produce a top layer. In some cases, it may be desirable to use a novolac resin with the highest weight average molecular weight that maintains its solubility in common coating solvents, such as acetone, tetrahydrofuran, and 1-methoxypropan-2-ol. Top layers comprising novolac resins, including for example m-cresol only novolac resins (i.e. those that contain at least about 97 mol % m-cresol) and m-cresol/p-cresol novolac resins that have up to 10 mol % of p-cresol, having a weight average molecular weight of about 10,000 to at least about 25,000, may be used. Top layers comprising m-cresol/p-cresol novolac resins with at least 10 mol % p-cresol, having a weight average molecular weight of about 8,000 to about 25,000, may also be used. In some instances, novolac resins prepared by solvent condensation may be desirable.

The top layer typically comprises a dissolution inhibitor, which functions as a solubility-suppressing component for the binder. Dissolution inhibitors have polar functional groups that are believed to act as acceptor sites for hydrogen bonding with the hydroxyl groups present in the binder. The acceptor sites comprise atoms with high electron density, preferably selected from electronegative first row elements, especially carbon, nitrogen, and oxygen. Dissolution inhibitors that are soluble in the developer are preferred.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, and quaternized heterocyclic compounds such as quinolinium compounds, benzothiazolium compounds, pyridinium compounds, and imidazolium compounds. Compounds containing other polar groups, such as ether, amine, azo, nitro, ferrocenium, sulfoxide, sulfone, and disulfone may also be useful as dissolution inhibitors. The dissolution inhibitor may be a monomeric and/or polymeric compound that comprises a diazobenzoquinone moiety and/or a diazonaphthoquinone moiety.

A preferred group of dissolution inhibitors are triarylmethane dyes, such as ethyl violet, crystal violet, malachite green, brilliant green, Victoria blue B, Victoria blue R, Victoria blue BO, BASONYL® Violet 610, and D11 (PCAS, Longjumeau, France). These compounds can also act as contrast dyes, which distinguish the unimaged regions from the imaged regions in the developed imageable element.

When a dissolution inhibitor is present in the top layer, it typically comprises at least about 0.1 wt %, typically about 0.5 wt % to about 30 wt %, preferably about 1 wt % to 15 wt %, based on the dry weight of the layer.

Alternatively, or additionally, the polymeric material in the top layer can comprise polar groups that act as acceptor sites for hydrogen bonding with the hydroxy groups present in the polymeric material and, thus, act as both the polymeric material and dissolution inhibitor. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. Derivatization of phenolic resins with compounds that contain the diazonaphthoquinone moiety is well known and is described, for example, in West, U.S. Pat. Nos. 5,705,308, and 5,705,322.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

Photothermal Conversion Material

Imageable elements that are to be imaged with infrared radiation typically comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include, for example, dyes and pigments. Suitable pigments include, for example, carbon black, Heliogen Green, Nigrosine Base, iron (III) oxide, manganese oxide, Prussian Blue, and Paris blue. Because of its low cost and wide absorption bands that allow it to be used with imaging devices having a wide range of peak emission wavelengths, one particularly useful pigment is carbon black. The size of the pigment particles should not be more than the thickness of the layer that contains the pigment. Preferably, the size of the particles will be half the thickness of the layer or less.

To prevent sludging of the developer by insoluble material, photothermal conversion materials that are soluble in the developer are preferred. The photothermal conversion material may be a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis(chalcogenopyrylo)polymethine, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; Patel, U.S. Pat. No. 5,208,135; and Chapman, U.S. Pat. No. 5,401,618. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), SpectralR 830A and SpectralR 840A (Spectra Colors), as well as IR Dye A, and IR Dye B, whose structures are shown below.

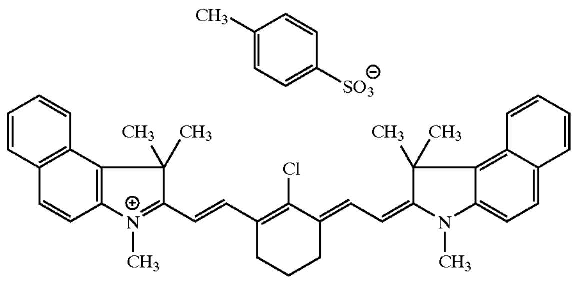

IR Dye A

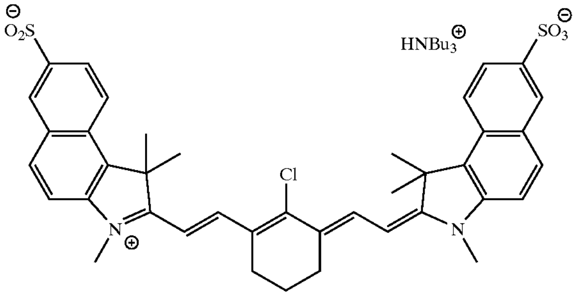

IR Dye B

To prevent ablation during imaging with infrared radiation, the top layer is substantially free of photothermal conversion material. That is, the photothermal conversion material in the top layer, if any, absorbs less than about 10% of the imaging radiation, preferably less than about 3% of the imaging radiation, and the amount of imaging radiation absorbed by the top layer, if any, is not enough to cause ablation of the top layer.

The amount of infrared absorber is generally sufficient to provide an optical density of at least 0.05, and preferably, an optical density of from about 0.5 to at least about 2 to 3 at the imaging wavelength. As is well known to those skilled in the art, the amount of compound required to produce a particular optical density can be determined from the thickness of the underlayer and the extinction coefficient of the infrared absorber at the wavelength used for imaging using Beer's law. When the infrared absorber is present in the underlayer, infrared absorber typically comprises about 0.1 to 20% by weight, more preferably about 0.5 to 10% by weight, of the underlayer, based on the total weight of the underlayer.

Other Layers

When an absorber layer is present, it is between the top layer and the underlayer. The absorber layer preferably consists essentially of the infrared absorber and, optionally, a surfactant. It may be possible to use less of the infrared absorber if it is present in a separate absorber layer. The absorber layer preferably has a thickness sufficient to absorb at least 90%, preferably at least 99%, of the imaging radiation. Typically, the absorber layer has a coating weight of about 0.02 $g/m^2$ to about 2 $g/m^2$, preferably about 0.05 $g/m^2$ to about 1.5 $g/m^2$. Elements that comprise an absorber layer are disclosed in Shimazu, U.S. Pat. No. 6,593,055, the disclosure of which is incorporated herein by reference.

To further minimize migration of the infrared absorber from the underlayer to the top layer during manufacture and storage of the imageable element, the element may comprise a barrier layer between the underlayer and the top layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer. Imageable elements that comprise a barrier layer are disclosed in U.S. Pat. Pub. 2003/0108817 A1, the disclosure of which is incorporated herein by reference.

Preparation of the Imageable Element

The imageable element may be prepared by sequentially applying the underlayer over the hydrophilic surface of the substrate; applying the absorber layer or the barrier layer if present, over the underlayer; and then applying the top layer using conventional techniques.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The underlayer may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating. The underlayer may be applied, for example, from mixtures of methyl ethyl ketone, 1-methoxypropan-2-ol, butyrolactone, and water; from mixtures of diethyl ketone, water, methyl lactate, and butyrolactone; and from mixtures of diethyl ketone, water, and methyl lactate.

When neither a barrier layer nor an absorber layer is present, the top layer is coated on the underlayer. To prevent the underlayer from dissolving and mixing with the top layer, the top layer should be coated from a solvent in which the underlayer layer is essentially insoluble. Thus, the coating solvent for the top layer should be a solvent in which the components of the top layer are sufficiently soluble that the top layer can be formed and in which any underlying layers are essentially insoluble. Typically, the solvents used to coat the underlying layers are more polar than the solvent used to coat the top layer. The top layer may be applied, for example, from diethyl ketone, or from mixtures of diethyl ketone and 1-methoxy-2-propyl acetate. An intermediate drying step, i.e., drying the underlayer, if present, to remove coating solvent before coating the top layer over it, may also be used to prevent mixing of the layers.

Alternatively, the underlayer, the top layer or both layers may be applied by conventional extrusion coating methods from a melt mixture of layer components. Typically, such a melt mixture contains no volatile organic solvents.

Imaging of the Imageable Elements

The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (CREO, Burnaby, British Columbia, Canada), the Screen PlateRite Model 4300, Model 8600, and Model 8800 (Screen, Rolling Meadows, Chicago, Ill., USA), and the Gerber Crescent 42T (Gerber Systems, South Windsor, Conn., USA).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers the GS618-400 thermal plotter (Oyo Instruments, Houston, Tex., USA), or the Model VP-3500 thermal printer (Seikosha America, Mahwah, N.J., USA).

Industrial Applicability

The method of the invention produces an image that is useful as a lithographic printing plate. After the imageable element has been imaged and developed to form a lithographic printing plate, printing can then be carried out by applying a fountain solution and then lithographic ink to the image on its surface. The fountain solution is taken up by the surface of the hydrophilic substrate revealed by the imaging and development process, and the ink is taken up by the regions not removed by the development process. The ink is then transferred to a suitable receiving material (such as cloth, paper, metal, glass or plastic) either directly or indirectly using an offset printing blanket to provide a desired impression of the image thereon.

EXAMPLES

Glossary

956 Developer Solvent based (phenoxyethanol) developer (Kodak Polychrome Graphics, Norwalk, Conn., USA)

CREO® Trendsetter 3230 Commercially available platesetter, using Procom Plus software and operating at a wavelength of 830 nm (Creo Products, Burnaby, BC, Canada)

Goldstar™ developer Developer containing sodium metasilicate pentahydrate (Kodak Polychrome Graphics, Norwalk, Conn., USA)

SWORD® Excel Thermally sensitive, positive working, multi-layer, printing plate precursor, 0.3 mm gauge, size 762 mm×152.4 mm (30×6 inches) (Kodak Polychrome Graphics, Norwalk, Conn., USA)

SWORD™ II Processor Spray-on type processor, 850 mm width (Glunz and Jensen, Elkwood, Va., USA)

SWORD® Ultra Thermally sensitive, positive working, multi-layer, printing plate precursor, 0.3 mm gauge, size 762 mm×152.4 mm (30×6 inches) (Kodak Polychrome Graphics, Norwalk, Conn., USA)

Example 1

SWORD® Excel printing plate precursors were imaged with 830 nm radiation using an internal test pattern on a CREO® 3230 Trendsetter (120 mJ/cm$^2$, 250 rpm, 13.25 W laser power). The internal test pattern contained 0, 2, 5, 10, 20, 30, 40, 50, 60, 70, 80, 90, 95, 98 and 100% dot images.

Imaging was carried out using CREO® Staccato (FM) 10 micron and 20 micron screen ruling at about 94.5 lines per cm (200 line pairs per inch) and a test pattern using the more familiar about 113.4 lines per cm (240 line pairs per inch), round dot AM screen rulings.

A Unigraph Compact Microtec 60 desktop plate processor (Unigraph Equipment, Thetford, UK) was modified such that developer could be pumped from a container, through a pump (Model AC-56-Md, March Manufacturing, Glenview, Ill., USA) and valve, into a spray bar (8 holes, about 25.4 mm (1 inch) apart). Low levels of developer can be dribbled onto the incoming imageable element. The developer spreads over the surface of the imageable element. The scrubbing roller is a plush roller. Excess and used developer exits the processor through a drain in the processor tank floor and is disposed of. The processor had the following measurements:

Scrubbing roller speed=about 40 revolutions per minute

Transport speed=about 1.8 cm/sec (3.5 ft/min).

Nip to nip time=15 seconds

Nip to scrubbing roller length=about 20.3 cm (8 inches)

Nip to nip length=about 29.2 cm (11.5 inches.)

With the above conditions, the minimum amount of developer required to reliably wet out the surface of the incoming imageable element was 3.7 L of developer per $m^2$ of imaged imageable element (341 ml/$ft^2$).

The imaged imageable elements were developed in 956 Developer, a solvent based developer, using the processor described above. The developer had a pH of 9.75. The developer temperature was 21.5° C.

Five imaged imageable elements were processed on day one. Five imaged imageable elements stored for two weeks and processed two weeks later. The resulting printing plates were briefly rinsed in tap water and left to air dry. Although a finishing solution is typically used instead of the water rinse, no plate finisher was used because the absence of finisher makes the subsequent resolution measurements easier and more accurate.

Resolution was measured using a Gretag 196 densitometer (GretagMacBeth AG, Regensdorf, Switzerland). Resolution is shown in Table 1.

Example 2

Example 1 was repeated, except that (1) SWORD® Ultra printing plate precursors were used and (2) the precursors were imaged with 830 nm radiation using an internal test pattern on the CREO® 3230 Trendsetter at 105 mJ/$cm^2$ (250 rpm, 11.5 W laser power).

The imaged imageable elements were processed using Goldstar™ developer in the processor described above. The results are shown in Table 2.

TABLE 1

| | 10 Micron Staccato Screen | | | 20 Micron Staccato Screen | | | 240 lpi, round dot AM Screen | | |
|---|---|---|---|---|---|---|---|---|---|
| Theoretical Dot (%) | 0.58 $m^2$ of plate processed on day 1 | 0.58 $m^2$ of plate processed 2 weeks later | Dot difference | 0.58 $m^2$ of plate processed on day 1 | 0.58 $m^2$ of plate processed 2 weeks later | Dot difference | 0.58 $m^2$ of plate processed on day 1 | 0.58 $m^2$ of plate processed 2 weeks later | Dot difference |
| | Measured Dot (%) | | | Measured Dot (%) | | | Measured Dot (%) | | |
| 0 | 0 | 0 | 0 | 0 | 0 | 0 | 0 | 0 | 0 |
| 2 | 2 | 1 | 1 | 1 | 2 | 1 | 2 | 2 | 0 |
| 5 | 4 | 3 | 1 | 4 | 5 | 1 | 5 | 4 | 1 |
| 10 | 8 | 7 | 1 | 9 | 9 | 0 | 9 | 9 | 0 |
| 20 | 18 | 17 | 1 | 18 | 18 | 0 | 19 | 19 | 0 |
| 30 | 29 | 28 | 1 | 28 | 28 | 0 | 28 | 28 | 0 |
| 40 | 38 | 39 | 1 | 39 | 38 | 1 | 38 | 38 | 0 |
| 50 | 49 | 50 | 1 | 49 | 48 | 1 | 48 | 49 | 1 |
| 60 | 60 | 61 | 1 | 59 | 58 | 1 | 60 | 59 | 1 |
| 70 | 70 | 71 | 1 | 68 | 69 | 1 | 71 | 70 | 1 |
| 80 | 80 | 80 | 1 | 78 | 79 | 1 | 79 | 79 | 0 |
| 90 | 90 | 91 | 1 | 89 | 90 | 1 | 89 | 89 | 0 |
| 95 | 95 | 96 | 1 | 94 | 95 | 1 | 95 | 96 | 1 |
| 98 | 99 | 99 | 0 | 98 | 98 | 0 | 99 | 98 | 1 |
| 100 | 100 | 100 | 0 | 100 | 100 | 0 | 100 | 100 | 0 |

TABLE 2

| Theoretical Dot (%) | 10 Micron Staccato Screen: 0.58 m² of plate processed on day 1 | 10 Micron: 0.58 m² of plate processed 2 weeks later | 10 Micron: Dot difference | 20 Micron Staccato Screen: 0.58 m² of plate processed on day 1 | 20 Micron: 0.58 m² of plate processed 2 weeks later | 20 Micron: Dot difference | 240 lpi, round dot AM Screen: 0.58 m² of plate processed | 240 lpi: 0.58 m² of plate processed 2 weeks later | 240 lpi: Dot difference |
|---|---|---|---|---|---|---|---|---|---|
| | Measured Dot (%) | | | Measured Dot (%) | | | Measured Dot (%) | | |
| 0 | 0 | 0 | 0 | 0 | 0 | 0 | 0 | 0 | 0 |
| 2 | 2 | 3 | 1 | 1 | 2 | 1 | 2 | 3 | 1 |
| 5 | 4 | 5 | 1 | 4 | 5 | 1 | 5 | 5 | 0 |
| 10 | 10 | 12 | 2 | 10 | 11 | 1 | 10 | 10 | 0 |
| 20 | 22 | 21 | 1 | 21 | 22 | 1 | 19 | 20 | 1 |
| 30 | 32 | 31 | 1 | 32 | 32 | 0 | 29 | 30 | 1 |
| 40 | 43 | 43 | 0 | 42 | 42 | 0 | 39 | 41 | 2 |
| 50 | 53 | 53 | 0 | 52 | 52 | 0 | 50 | 51 | 1 |
| 60 | 63 | 63 | 0 | 62 | 63 | 1 | 60 | 51 | 1 |
| 70 | 73 | 72 | 1 | 72 | 73 | 1 | 70 | 71 | 1 |
| 80 | 83 | 82 | 1 | 82 | 82 | 0 | 80 | 81 | 1 |
| 90 | 92 | 92 | 0 | 91 | 92 | 1 | 90 | 91 | 1 |
| 95 | 97 | 96 | 1 | 96 | 96 | 0 | 94 | 95 | 1 |
| 98 | 99 | 99 | 0 | 98 | 98 | 0 | 97 | 98 | 1 |
| 100 | 100 | 100 | 0 | 100 | 100 | 0 | 100 | 100 | 0 |

Example 3

SWORD® Excel printing plate precursors were imaged with 830 nm radiation using an internal test pattern on a CREO® 3230 Trendsetter (120 mJ/cm$^2$, 230 rpm, 11.5 W laser power). The internal test pattern contained 0, 2, 5, 10, 25, 35, 40, 50, 60, 70, 80, 90, 95, 98 and 100% dot images. The imagewise exposure was carried out using a CREO® Staccato (FM) 10 micron and 20 micron screen ruling at about 94.5 lines per cm (200 line pairs per inch) and a test pattern using the more familiar about 113.4 lines per cm (240 line pairs per inch), round dot AM screen rulings.

The imaged imageable elements were developed using 956 developer in an apparatus similar depicted in FIG. 1. A Unigraph Compact Microtec 60 desktop plate processor (Unigraph Equipment Ltd, Thetford, UK) was modified such that developer could be pumped from a container, through a pump (model AC-56-Md, March Manufacturing Inc., Glenview, Ill.) and valve, into a slot coater 1. Developer was applied to the complete face of an incoming imaged imageable element 61 at low levels. Scrubbing roller 66 is a plush roller. Excess and used developer exited the processor through a drain in the processor tank floor. The processor had the following measurements:

Scrubbing roller 66 speed=about 40 revolutions per minute

Transport speed=about 1.8 cm/sec (3.5 ft/min).

Nip to nip time=15 seconds

Nip to scrubbing roller 66 length=about 20.3 cm (8 inches)

Nip to nip length=about 29.2 cm (11.5 inches.)

The minimum amount of developer required to reliably wet out the surface of the incoming imaged imageable element was 1.6 liters of developer per m$^2$ (150 ml of developer per square foot) of imaged imageable element. The resulting printing plates were evaluated as described in Example 1. The results are given in Table 3.

TABLE 3

| Theoretical Dot (%) | 10 Micron Staccato Screen: 0.58 m² of plate processed on day 1 | 10 Micron: 0.58 m² of plate processed 2 weeks later | 10 Micron: Dot difference | 20 Micron Staccato Screen: 0.58 m² of plate processed on day 1 | 20 Micron: 0.58 m² of plate processed 2 weeks later | 20 Micron: Dot difference |
|---|---|---|---|---|---|---|
| | Measured Dot (%) | | | Measured Dot (%) | | |
| 0 | 0 | 0 | 0 | 0 | 0 | 0 |
| 2 | 2 | 1 | 1 | 3 | 2 | 1 |
| 5 | 6 | 5 | 1 | 5 | 4 | 1 |
| 10 | 10 | 9 | 2 | 9 | 8 | 1 |
| 25 | 25 | 24 | 1 | 25 | 26 | 1 |
| 35 | 36 | 35 | 1 | 36 | 36 | 0 |
| 40 | 41 | 40 | 1 | 40 | 41 | 1 |
| 50 | 52 | 51 | 1 | 51 | 51 | 0 |
| 60 | 58 | 59 | 1 | 59 | 59 | 0 |
| 70 | 68 | 69 | 1 | 69 | 68 | 1 |
| 80 | 79 | 78 | 1 | 79 | 79 | 0 |
| 90 | 89 | 90 | 1 | 89 | 89 | 0 |
| 95 | 95 | 95 | 0 | 95 | 95 | 0 |
| 98 | 98 | 98 | 0 | 98 | 98 | 0 |
| 100 | 100 | 100 | 0 | 100 | 100 | 0 |

TABLE 3-continued

| | 240 lpi, round dot AM Screen | | |
|---|---|---|---|
| Theoretical Dot (%) | 0.58 $m^2$ of plate processed | 0.58 $m^2$ of plate, processed 2 weeks later Measured Dot (%) | Dot difference |
| 0 | 0 | 0 | 0 |
| 2 | 2 | 2 | 0 |
| 5 | 5 | 6 | 1 |
| 10 | 9 | 9 | 0 |
| 25 | 24 | 24 | 0 |
| 40 | 38 | 38 | 0 |
| 50 | 48 | 48 | 0 |
| 60 | 58 | 58 | 0 |
| 70 | 68 | 69 | 1 |
| 80 | 79 | 79 | 0 |
| 90 | 89 | 88 | 1 |
| 95 | 95 | 95 | 0 |
| 98 | 97 | 97 | 0 |
| 100 | 100 | 100 | 0 |

Comparative Example 1

A SWORD® Excel printing plate precursor was imaged with 830 nm radiation, using an internal test pattern on a CREO® 3230 Trendsetter at an exposure energy of 120 mJ/cm$^2$ (250 rpm and 13.25 W laser power). The internal test pattern contained 1, 2, 3, 5, 10, 15, 20, 30, 40, 45, 50, 55, 60, 70, 80, 85, 90, 95, 98, 99, 99.5 and 100% dot images. Imaging was carried out using CREO® Staccato (FM) 10 micron and 20 micron screen ruling at about 94.5 lines per cm (200 line pairs per inch) and a test pattern using the more familiar about 113.4 lines per cm (240 line pairs per inch), round dot AM screen rulings.

The resulting imaged precursor was developed using an 850 SWORD™ II plate processor in the following configuration: 956 Developer; 20 inch, 15 micron per filter (Stonehand, Denver, Colo., USA); two plush rollers in the developer tank; processing speed, 1.07 m/min (3.5 ft/min); initial charge of developer, 56.8 L (15 gallons); developer replenishment rate, 21.5 ml/m$^2$ (2 ml/ft$^2$) of imaged precursor developed in the developer. The 956 Developer was used as the replenisher. The processor had been recently cleaned and new developer and filters installed. The resolution of the resulting printing plate was measured using an X-Rite 528 densitometer (CannonDirect, Bethel, Ohio, USA).

After the imaged precursor had been developed, 9.3 m$^2$ (100 ft$^2$) increments of imaged (as above, but with a solid, 100% exposure pattern, in AM mode) SWORD® Excel printing plate precursor were developed through the processor so that the developer was subjected to dissolving and dispersing the top layer and underlayer composition in a manner seen in a pre-press environment. After each about 9.3 m$^2$ (100 ft$^2$) increment, the pH of the developer was measured.

After about 140 m$^2$ (1500 ft$^2$) of imaged precursor had been developed, another SWORD® Excel printing plate precursor was imaged as above using CREO® Staccato 10 micron and 20 micron screen rulings and a test pattern using the more familiar about 113.4 lines per cm (240 line pairs per inch), developed, and its resolution measured.

Further about 9.3 m$^2$ (100 ft$^2$) increments of AM imaged precursor were developed. After about 205 m$^2$ (2200 ft$^2$) of imaged precursor had been developed, another SWORD® Excel printing plate precursor was imaged as above using the CREO® Staccato 10 micron and 20 micron screen rulings, developed, and its resolution measured. Resolution for the resulting printing plates is shown in Table 4. The pH readings of the developer during the developer cycle are shown in Table 5.

TABLE 4

| | 10 Micron Staccato Screen | | | 20 Micron Staccato Screen | | | 240 lpi, round dot AM Screen | | |
|---|---|---|---|---|---|---|---|---|---|
| Area Processed (ft$^2$) | 0 | 1500 | 2200 | 0 | 1500 | 2200 | 0 | 1500 | 2200 |
| Theoretical Dot (%) | Measured Dot (%) | | | Measured Dot (%) | | | Measured Dot (%) | | |
| 50 | 47 | 48 | 52 | 46 | 48 | 50 | 49 | 49 | 49 |
| 60 | 56 | 57 | 62 | 56 | 57 | 59 | 59 | 59 | 59 |
| pH | 9.75 | 9.56 | 9.34 | 9.75 | 9.56 | 9.34 | 9.75 | 9.56 | 9.34 |
| Temperature (° C.) | 21.6 | 23.1 | 23.2 | 21.6 | 23.1 | 23.2 | 21.6 | 23.1 | 23.2 |

TABLE 5

| Area processed (ft$^2$) | pH | Temperature (° C.)$^a$ |
|---|---|---|
| 0 | 9.75 | 21.6 |
| 100 | 9.72 | 21.6 |
| 200 | 9.70 | 21.5 |
| 300 | 9.69 | 21.6 |
| 400 | 9.67 | 22.3 |

TABLE 5-continued

| Area processed ($ft^2$) | pH | Temperature (° C.)[a] |
|---|---|---|
| 500 | 9.62 | 21.9 |
| 600 | 9.60 | 22.2 |
| 700 | 9.59 | 22.3 |
| 800 | 9.59 | 22.4 |
| 900 | 9.58 | 22.5 |
| 1000 | 9.57 | 22.5 |
| 1100 | 9.58 | 22.7 |
| 1200 | 9.57 | 22.9 |
| 1300 | 9.56 | 23.2 |
| 1400 | 9.56 | 23.6 |
| 1500 | 9.56 | 23.1 |
| 1600 | 9.52 | 22.6 |
| 1700 | 9.49 | 22.1 |
| 1800 | 9.48 | 22.0 |
| 1900 | 9.46 | 22.1 |
| 2000 | 9.42 | 22.7 |
| 2100 | 9.37 | 23.1 |
| 2200 | 9.34 | 23.2 |

[a]Temperature at which the pH was measured.

The developer shows an unacceptable downward drift in pH (0.41 unit) over the lifetime of the developer.

With a 10 micron FM screen ruling, the observed dot percentages vary throughout the cycle by 5 and 6%. With a 20 micron FM screen ruling, the observed dot percentages vary throughout the cycle by 3 and 4%. This would be unacceptable in a typical pre-press environment.

Having described the invention, we now claim the following and their equivalents.

What is claimed is:

1. The invention is a method for forming an image comprising the steps of:

a) thermally imaging a multi-layer imageable element and forming an imaged imageable element comprising imaged and complementary unimaged regions;

in which:

the imageable element comprises a substrate, an underlayer over the substrate, and a top layer over the underlayer;

the element comprises a photothermal conversion material;

the top layer is substantially free of the photothermal conversion material;

the top layer is ink receptive;

before thermal imaging, the top layer is not removable by an alkaline developer;

after thermal imaging, the imaged regions are removable by the developer; and the underlayer is removable by the developer; and b) developing the imaged imageable element with the developer and removing the imaged regions without substantially affecting the unimaged regions;

in which:

the developer is fresh developer; and the developer is not reused.

2. The method of claim 1 in which the developer is a solvent based developer, and the developer has a pH below about 10.5.

3. The method of claim 1 in which the developer is a high pH developer.

4. The method of claim 1 in which about 0.5 L to 4.0 L of developer is used per $m^2$ of imaged imageable element.

5. The method of claim 4 in which imaging is carried out using stochastic screening.

6. The method of claim 1 in which the top layer comprises a novolac resin and a dissolution inhibitor.

7. The method of claim 6 in which the underlayer comprises a copolymer of N-phenylmaleimide, methacrylamide, and methacrylic acid.

8. The method of claim 1 in which imaging is carried out using stochastic screening.

9. The method of claim 8 in which the top layer comprises a novolac resin and a dissolution inhibitor.

10. The method of claim 9 in which the underlayer comprises a copolymer of N-phenylmaleimide, methacrylamide, and methacrylic acid.

11. The method of claim 10 in which the developer is a solvent based developer, and the developer has a pH below about 10.5.

12. The method of claim 11 in which about 0.5 L to 4.0 L of developer is used per $m^2$ of imaged imageable element.

13. The method of claim 10 in which the developer is a high pH developer.

14. The method of claim 13 in which about 0.5 L to 4.0 L of developer is used per $m^2$ of imaged imageable element.

* * * * *